(12) United States Patent
Shirley

(10) Patent No.: US 6,366,509 B2
(45) Date of Patent: Apr. 2, 2002

(54) METHOD AND APPARATUS FOR REPAIRING DEFECTIVE COLUMNS OF MEMORY CELLS

(75) Inventor: Brian M. Shirley, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/764,952

(22) Filed: Jan. 16, 2001

Related U.S. Application Data

(63) Continuation of application No. 09/353,575, filed on Jul. 15, 1999, now Pat. No. 6,185,136.

(51) Int. Cl.$^7$ .................................................. G11C 7/00
(52) U.S. Cl. ........................ 365/200; 365/190; 365/196
(58) Field of Search ................................ 365/200, 190, 365/189.11, 202, 210, 196, 225.7, 230.03

(56) References Cited

U.S. PATENT DOCUMENTS

| | | | |
|---|---|---|---|
| 5,724,282 A | 3/1998 | Loughmiller et al. | 365/96 |
| 5,787,044 A | 7/1998 | Duesman | 365/200 |
| 5,844,833 A | 12/1998 | Zagar et al. | 365/149 |
| 5,978,291 A | * 11/1999 | Kirihata | 365/200 |
| 5,982,682 A | 11/1999 | Nevill et al. | 365/201 |
| 6,111,797 A | * 8/2000 | Shirley | 365/200 |
| 6,118,710 A | * 9/2000 | Tsuji | 365/200 |

* cited by examiner

Primary Examiner—Richard Elms
Assistant Examiner—Hien Nguyen
(74) Attorney, Agent, or Firm—Dorsey & Whitney LLP

(57) ABSTRACT

A pair of coupling transistors are connected in series with isolation transistors in each of a plurality of column node circuits coupled to first and second arrays of memory cells arranged in rows and columns. The coupling transistors for the complimentary digit lines in each column node circuit are rendered non-conductive in the event memory cells connected to the coupling transistors through digit lines of the first and second array are defective. As a result, defective memory cells in the first and second arrays are isolated from sense amplifiers in the column node circuits so that the sense amplifiers cannot affect non-defective memory cells.

19 Claims, 6 Drawing Sheets

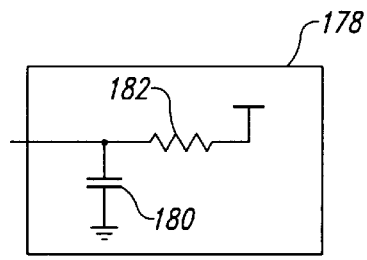
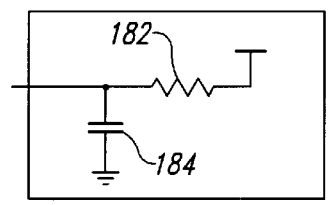
*Fig. 5A*   *Fig. 5B*
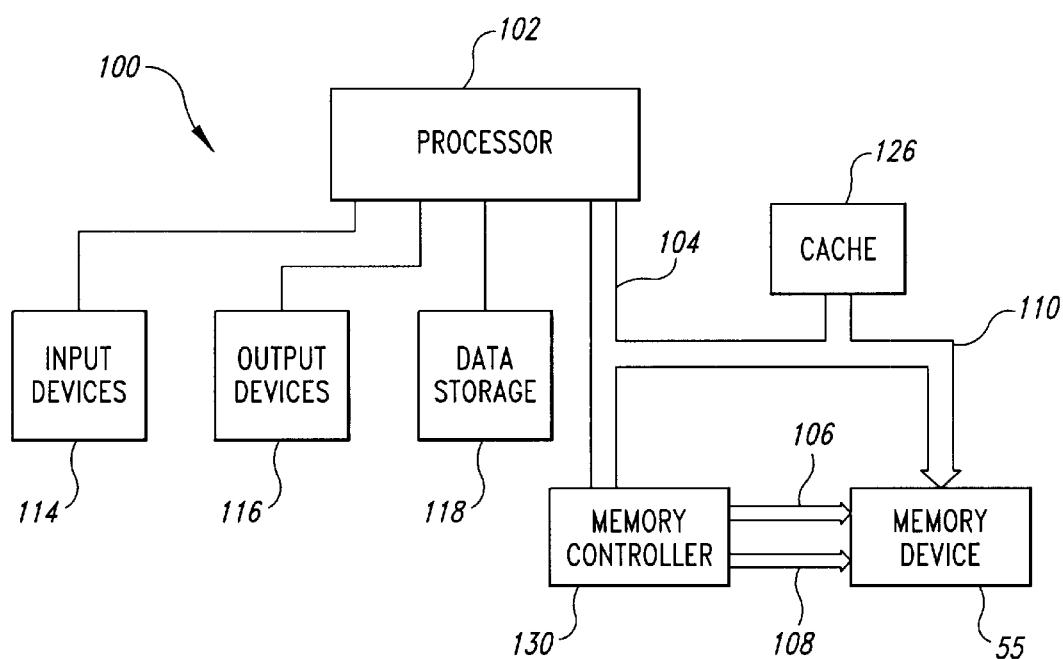
*Fig. 6*

METHOD AND APPARATUS FOR REPAIRING DEFECTIVE COLUMNS OF MEMORY CELLS

CROSS-REFERENCE TO RELATED APPLICATION

This application is a continuation of pending U.S. patent application Ser. No. 09/353,575, filed Jul. 15, 1999, now a U.S. Pat. No. 6,185,136.

TECHNICAL FIELD

The present invention relates to memory devices, particularly dynamic random access memory devices, and, more particularly, to a method and apparatus for preventing defective columns of memory cells from rendering the entire memory device defective.

BACKGROUND OF THE INVENTION

A conventional memory device is illustrated in FIG. 1 The memory device is a synchronous dynamic random access memory ("SDRAM") 10 that includes an address register 12 adapted to receive row addresses and column addresses through an address bus 14. The address bus 14 is generally coupled to a memory controller (not shown in FIG. 1). Typically, a row address is initially received by the address register 12 and applied to a row address multiplexer 18. The row address multiplexer 18 couples the row address to a number of components associated with either of two memory bank arrays 20 and 22 depending upon the state of a bank address bit forming part of the row address. The arrays 20 and 22 are comprised of memory cells arranged in rows and columns. Associated with each of the arrays 20 and 22 is a respective row address latch 26, which stores the row address, and a row decoder 28, which applies various signals to its respective array 20 or 22 as a function of the stored row address. The row address multiplexer 18 also couples row addresses to the row address latches 26 for the purpose of refreshing the memory cells in the arrays 20 and 22. The row addresses are generated for refresh purposes by a refresh counter 30 that is controlled by a refresh controller 32.

After the row address has been applied to the address register 12 and stored in one of the row address latches 26, a column address is applied to the address register 12. The address register 12 couples the column address to a column address latch 40. Depending on the operating mode of the SDRAM 10, the column address is either coupled through a burst counter 42 to a column address buffer 44, or to the burst counter 42, which applies a sequence of column addresses to the column address buffer 44 starting at the column address output by the address register 12. In either case, the column address buffer 44 applies a column address to a column decoder 48, which applies various column signals to respective sense amplifiers in associated column circuits 50 for the arrays 20 and 22.

Data to be read from one of the arrays 20 or 22 are coupled from the arrays 20 or 22, respectively, to a data bus 58 through the column circuit 50, and a read data path that includes a data output register 56. Data to be written to one of the arrays 20 or 22 are coupled from the data bus 58 through a write data path, including a data input register 60, to one of the column circuits 50 where they are transferred to one of the arrays 20 or 22, respectively. A mask register 64 may be used to selectively alter the flow of data into and out of the column circuits 50 by, for example, selectively masking data to be read from the arrays 20 and 22.

The above-described operation of the SDRAM 10 is controlled by a command decoder 68 responsive to high level command signals received on a control bus 70. These high level command signals, which are typically generated by the memory controller, are a clock enable signal CKE*, a clock signal CLK, a chip select signal CS*, a write enable signal WE*, a row address strobe signal RAS*, and a column address strobe signal CAS*, where the "*" designates the signal as active low. The command decoder 68 generates a sequence of command signals responsive to the high level command signals to carry out a function (e.g., a read or a write) designated by each of the high level command signals. These command signals, and the manner in which they accomplish their respective functions, are conventional. Therefore, in the interest of brevity, a further explanation of these control signals will be omitted.

A portion of the column circuits 50 of FIG. 1 is shown in greater detail in FIG. 2. The column circuit 50 is shown connected to a pair of arrays 100, 102, which may be subarrays in either of the arrays 20, 22 shown in FIG. 1. Alternately, a single column circuit 50 containing the circuitry shown in FIG. 2 may be used to access both of the arrays 20, 22 shown in FIG. 1. The column circuit 50 includes a plurality of column node circuits 110a–n in addition to a redundant column node circuit 112. All of these column node circuits 110, 112 are identical, and, in the interest of clarity and brevity, the internal components of only one column node circuit 110a is shown in FIG. 2.

The column node circuit 110a interfaces with two columns of memory cells using two pairs of complementary digit lines $D_0$, $D_0^*$ and $D_1$, $D_1^*$, respectively. However, it will be understood that the column node circuit 110a may contain fewer or greater numbers of complimentary digit line pairs. In the interest of brevity, the digit lines $D_0$, $D_0^*$ and $D_1$, $D_1^*$ in the column node circuit 110 as well as in the other column node circuits 110b–n, 112 will sometimes be referred to as simply D and D*. Each digit line pair D, D* has coupled therebetween a negative sense amplifier 120, a positive sense amplifier 122, an equilibration circuit 124, and an I/O circuit 126.

The equilibration circuit 124 is controlled by a precharge control circuit 130 that may be part of the row decoders 28 (FIG. 1) to couple the digit lines D, D* to each other and to an equilibration voltage, which typically has a magnitude equal to one-half the magnitude of a supply voltage. The negative sense amplifier 120 and the positive sense amplifier 122 normally receive respective power signals, typically ground potential and either the supply voltage or a pumped voltage having a magnitude that is slightly greater than the magnitude of the supply voltage, respectively. After the digit lines D, D* have been equilibrated by the equilibration circuit 124, the sense amplifiers 120, 122 detect a voltage imbalance in the digit lines D, D* during a read access of memory cells in the arrays 100, 102. The sense amplifiers 120, 122 then drive the digit lines D, D* in the direction of the imbalance until one of the digit lines is at the supply voltage and the other of the digit lines is at ground potential.

Once the sense amplifiers 120, 122 have driven the digit lines D, D* to voltages indicative of the data read from a memory cell in the respective column, the digit lines $D_0$, $D_1^*$ are coupled to respective I/O lines I/OA, I/OA* by the I/O circuit 126. As is a well understood in the art, in a read memory access the signals from the digit lines are coupled to a DC sense amplifier (not shown), which applies a corresponding data signal to the data bus of the memory device. The other digit lines $D_1$, $D_1^*$ in the column node circuit 110a are similarly coupled to a respective pair of I/O lines I/OB, I/OB* by a respective I/O circuit 126.

In a write memory access, the I/O lines are driven by respective write drivers (not shown), and are coupled to the digit lines D, D* by the I/O circuit 126.

The column node circuit 110a receives a SEL_R signal from a respective inverter 114 to cause it to couple its digit lines D, D* to the I/O lines I/O, I/O*, respectively. Similarly, the column node circuit 110b receives a SEL_R+1 signal to couple its digit lines to the same I/O lines, and the column node circuit 110n receives a SEL_R+N signal to couple its digit lines to the same I/O lines. Since the SEL signals select various columns of memory cells in the arrays 100, 102, they are normally generated by the column decoder 48 (FIG. 1).

The I/O circuits 126 in the redundant column node circuit 112 are likewise coupled to the same I/O lines by a select SEL_RED signal, but the SEL_RED signal is generated by a redundant column control circuit 144. The redundant column control circuit 144 may be part of the column decoder 48 (FIG. 1).

As mentioned above, the column node circuits 110a–n, 112 are coupled to both arrays 110, 102. However, the column node circuits cannot receive signals indicative of read data from both arrays 100, 102 at the same time. For this reason, isolation transistors 150, 152 are coupled between each digit line D, D* of the column node circuit and corresponding digit lines D, D*, respectively, of the arrays 100, 102. All of the isolation transistors 150 coupled to the array 100 are turned ON by a common ISO_LEFT signal, and all of the isolation transistors 152 coupled to the array 102 are turned ON by a common ISO_RIGHT signal. Since the arrays 100, 102 contain rows of memory cells corresponding to different row addresses, the ISO_LEFT and ISO-RIGHT signals are typically generated by the row decoders 28 (FIG. 1).

Although the manufacturing yield of memory devices is very good, the large number of transistors, signal paths, and other components, such as capacitors, contained in memory devices creates a significant statistical probability that a memory device will contain at least one defective transistor, signal path or other component. For this reason, memory devices typically incorporate rows and columns of redundant memory cells. If a row or column of memory cells is found to be defective during testing, either before or after packaging the memory device, the memory device can be programmed to substitute a redundant row of memory cells for the defective row, or a redundant column of memory cells for the defective column. The redundant column node circuit 112 is provided to interface with redundant columns of memory cells in the arrays 100, 102. The redundant column node circuit 112 interfaces with two columns of memory cells, so that two redundant columns are substituted whenever a single defective column is found during testing. However, it will be understood that redundant columns can be substituted on a column-by-column basis, or that redundant columns can be substituted in groups larger than two. The number of digit lines D, D* in the redundant column node circuit 112 can be adjusted as desired to match the number of redundant columns that are substituted.

Redundant columns of memory cells markedly improve the manufacturing yield of memory devices. However, there are some defects that can occur that cannot be repaired by substituting a redundant column. For example, with reference to FIG. 3, a portion of the arrays 100, 102 includes access transistors 160 coupled between respective digit lines D, D* and a respective storage capacitor 162. Each access transistor 160 selectively couples a digit line D or D* to one plate of the storage capacitor 162. The other plate of the storage capacitor is a "cell plate" that is typically coupled to a voltage having a magnitude of one-half of the supply voltage. In operation, the storage capacitors 162 store voltages indicative of either a logic "0" or a logic "1".

The cell plate of each capacitor 162 is typically common to all of the storage capacitors 162. As a result of manufacturing defects, one of the digit lines D or D* may be shorted to the cell plate either directly (the usual failure mode) or through a shorted storage capacitor 162. During testing of the memory device, this defect will be detected, and a redundant column of memory cells will be substituted for the defective column. However, the sense amplifiers 120, 122 in the column node circuit 110 for the defective column normally continue to receive the NLAT and PSENSE signals from the row decoder 28. The sense amplifiers 120, 122 can thus couple the cell plate to either the supply voltage or ground potential thereby rendering the remainder of the memory cells defective.

Although this problem has been recognized in the past, none of the approaches that have been developed to deal with this problem are entirely satisfactory. One approach has been to selectively decouple the NLAT and PSENSE signals from the column node circuit 110 for the defective column of memory cells. Although this approach does prevent a shorted storage capacitor from rendering the remaining cells defective, it does so at great expense. The transistors that are used to selectively couple the NLAT and PSENSE signals to the column node circuits 110 must be physically very large to provide a sufficiently low impedance path to drive the sense amplifiers 120, 122 so that they can respond with sufficient speed. Driving the sense amplifiers 120, 122 through a relatively high impedance markedly slows the ability of the sense amplifiers 120, 122 to sense voltages on the digit lines D, D*, thereby reducing the access time of the memory device. The amount of surface area on a semiconductor die consumed by adding a relatively large transistor to each negative sense amplifier 120 and a relatively large transistor to each positive sense amplifier 122 is significant because of the large number of the sense amplifiers 120, 122 in a typical memory device.

Another problem with providing transistors to selectively couple the sense amplifiers 120, 122 to the row decoder 28 is the difficulty of routing signal lines in the memory device. More particularly, it would be necessary to supply each column node circuit 110 with two additional signal lines coupled to the gates of the transistors. However, it would be difficult to route this many signal lines to the column node circuits 110.

Another approach to preventing defective columns of memory cells from affecting other memory cells has been to place a laser fuse between each column node circuit 110 and the digit lines D, D* of the arrays 100, 102 to which they are connected. When a column of memory cells is found to be defective during testing, a redundant column of memory cells is substituted for the detective column, and the laser fuse coupling of the defective column to its column node circuit 110 is severed. While this approach has been satisfactory in the past, it is becoming less so because the minimum laser pitch has not kept up with decreases in digit line pitch. Furthermore, while this approach has been satisfactory for repairing defects found before the memory device has been packaged, it cannot be used for repairing post-packaging defects.

Although these problems have been explained with reference to the SDRAM 10 shown in FIG. 1, it will be understood that the same problems exist with other dynamic random access memories ("DRAMs") including asynchronous DRAMs and packetized DRAMs, such as synchronous link DRAMs ("SLDRAMs") and RAMBUS DRAMs ("RDRAMs").

There is therefore a need for a method and apparatus that can be used to repair post-packaging defects in a manner that prevents defective memory cells in a column from affecting other memory cells and which does not unduly increase the cost of memory devices.

SUMMARY OF THE INVENTION

A method and apparatus for repairing defective columns of memory cells in a memory device does so in a manner that prevents the defective memory cells from adversely affecting non-defective memory cells. In accordance with one aspect of the invention, a plurality of column node circuits are provided, each of which includes at least one pair of complimentary digit lines. Each of the column node circuits also includes a sense amplifier, an equilibration circuit, and an input/output circuit, each of which is coupled between a respective pair of the complimentary digit lines of the column node circuit. A first pair of coupling switches selectively couples each pair of complimentary digit lines in each column node circuit to a pair of complimentary digit lines for a respective column in a first array. A second pair of coupling switches may optionally be provided to selectively couple each pair of complimentary digit lines in each column node circuit to a pair of complimentary digit lines for a respective column in a second array. The coupling switches each have a conductive state determined by a respective column node disable signal, which is generated by a redundant column control circuit. The redundant column control circuit generates the column node disable signals so that the first and second coupling switches coupled to the respective column node circuits are non-conductive responsive to a redundant column of memory cells being substituted for the column of memory cells to which the column node circuit is coupled.

BRIEF DESCRIPTION OF THE DRAWINGS

FIGS. 5A and 5B are schematics illustrating various embodiments of control circuitry that may be used in the column circuitry of FIG. 4.

FIG. 6 is a block diagram of a computer system including the SDRAM of FIG. 1 containing the column circuitry of FIG. 4.

DETAILED DESCRIPTION OF THE INVENTION

Figure 2:
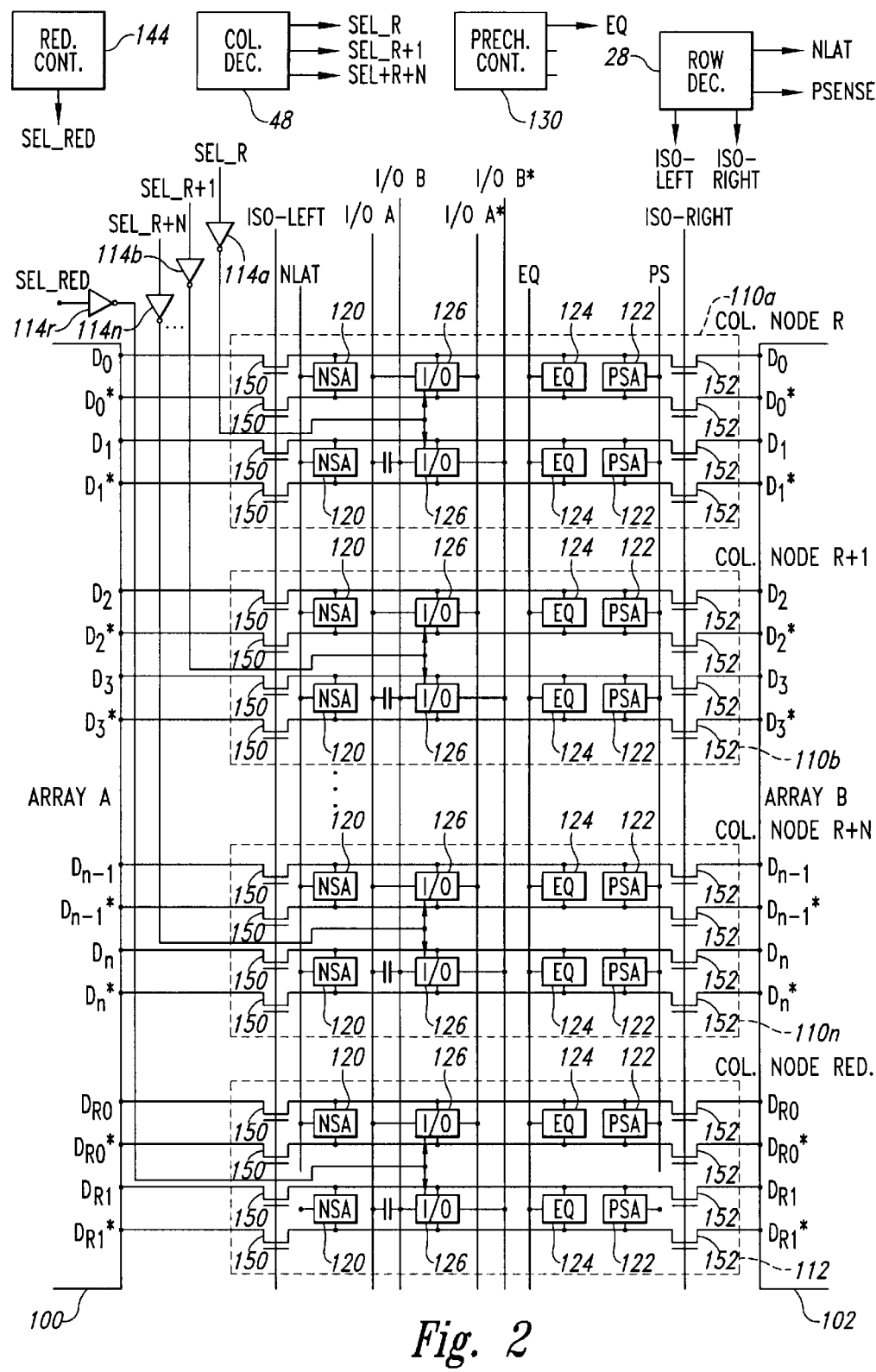
FIG. 2 is a block diagram and schematic diagram of a portion of column circuit used in the SLDRAM of FIG. 1.
Figure 3:
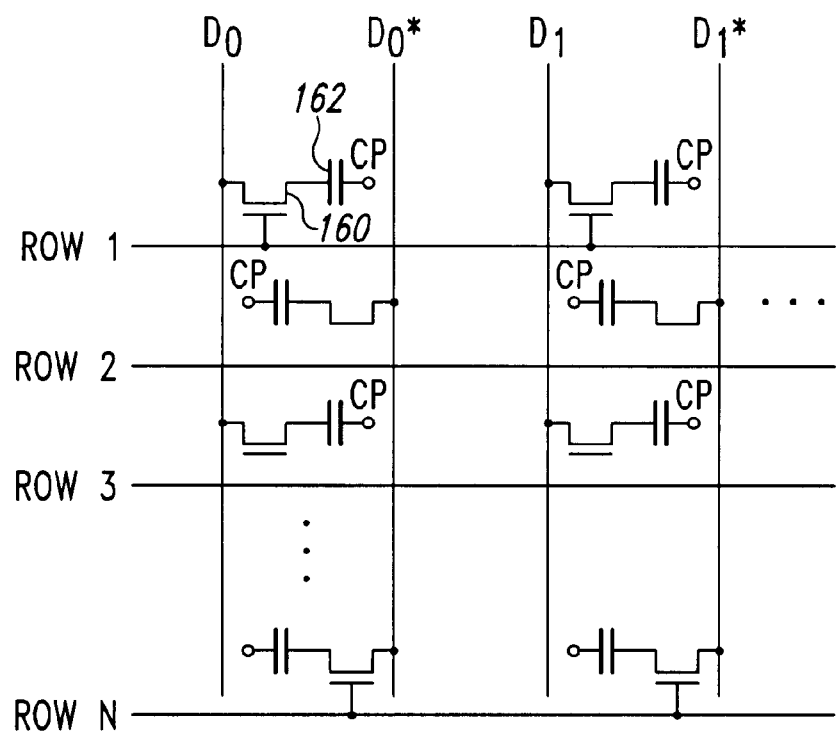
FIG. 3 is a schematic illustrating a portion of memory arrays used in the SLDRAM of FIG. 1, which interface with the circuitry shown in FIG. 2.
Figure 4A:
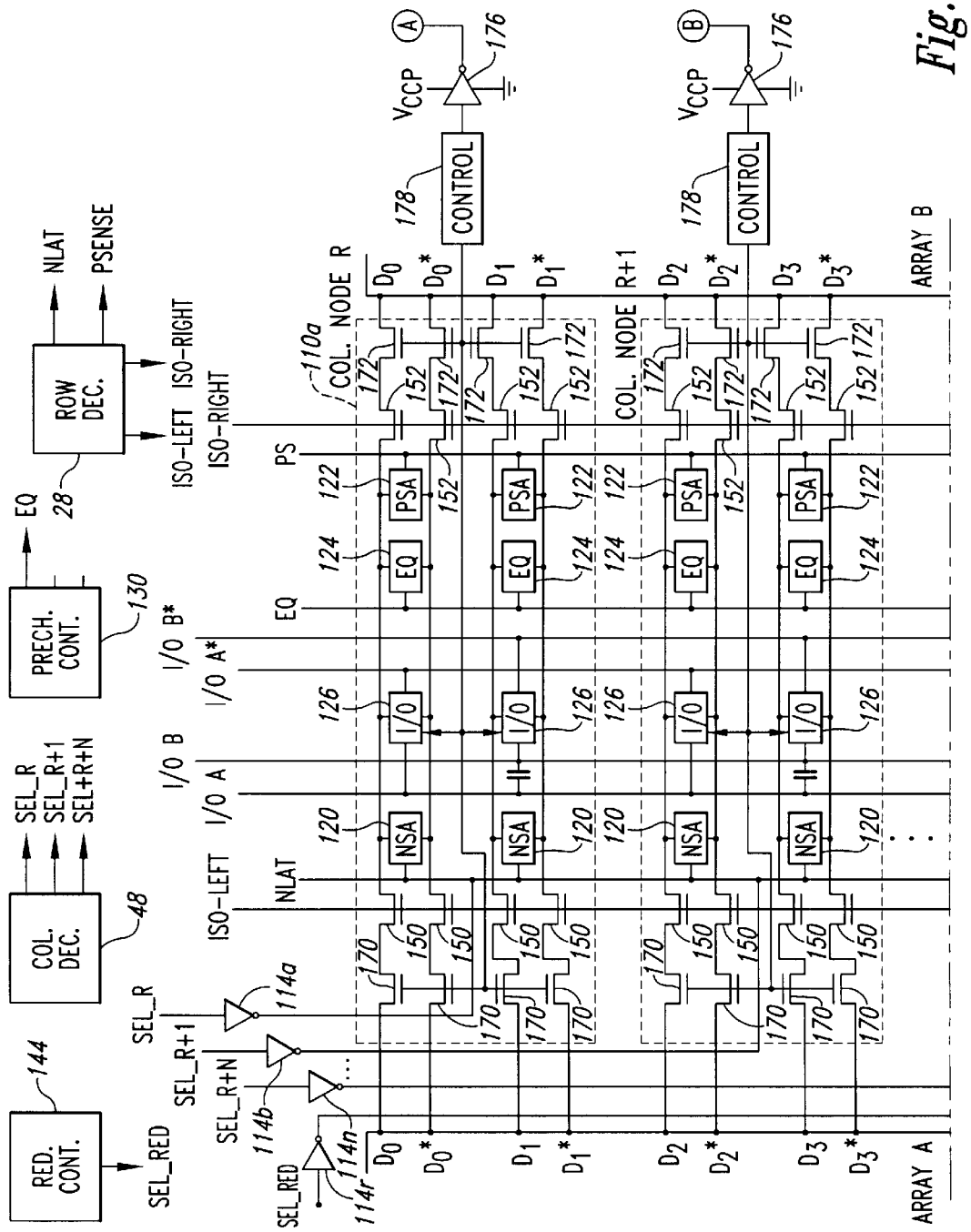
FIGS. 4A and 4B is a block diagram and schematic diagram of one embodiment of circuitry according to the invention that may be used in the SLDRAM of FIG. 1 in place of the column circuitry shown in FIG. 2.
Figure 4B:
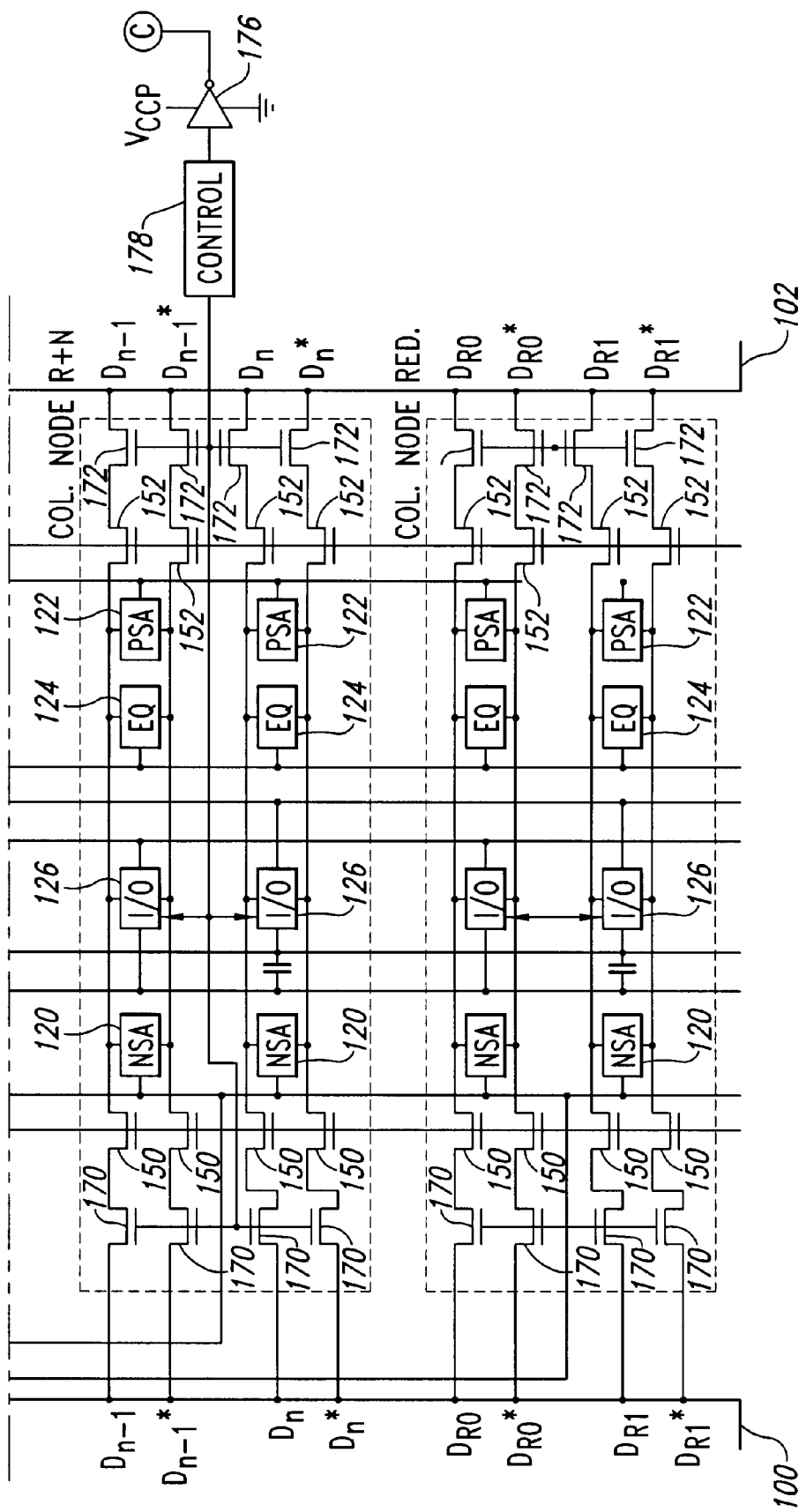

FIGS. 4A and 4B illustrate column circuitry according to one embodiment of the invention that can be used in the column circuit 50. The circuitry shown in FIG. 4 uses substantially the same column node circuits 110', used in the prior art column node circuits 110 of FIG. 2. Therefore, in the interest of brevity and clarity, identical components have been provided with the same reference numerals, and their operation will not be repeated.

With reference to FIGS. 4A and 4B, each of the column node circuits 110', except for the redundant column node circuit 112, includes a first coupling transistor 170 coupling each of its digit lines D, D* to the first array 100, and a second coupling transistor 172 coupling each of its digit lines D, D* to the second array 102. All of the coupling transistors 170, 172 have their gates connected to each other and to a respective inverter 176. A separate inverter is provided for each of the column node circuits 110'. Power terminals of the inverter 176 are connected to ground and to a pumped voltage Vccp, respectively, so that the inverter 176 outputs one of these two voltages. Each of the inverters 176 is driven by respective control circuitry 178. As shown in FIG. 5A, the control circuitry 178 may be simply a laser fuse 180 biased high by through a resistor 182, or, as shown in FIG. 5B, the control circuitry 178 may be an anti-fuse 184 that is also biased high through the resistor 182. The use of an anti-fuse 184 allows both pre-packaging and post-packaging repairs, while the use of a laser fuse 180 is limited to pre-packaging repairs. Alternatively, the control circuitry 178 may be appropriate circuitry (not shown) that interfaces with the redundant column control circuit 144. For example, if a column is defective, its associated control circuitry 178 may be programmed to compare its column address with each column address received by the memory device. In the event of a match, the control circuitry 178 may output an appropriate signal to the respective inverter 176.

In operation, the control circuitry 178 normally outputs a low thereby causing the inverter 176 to output a voltage of Vccp. The Vccp voltage renders the coupling transistors 170, 172 conductive so that the column node circuit 110' continues to interface with the arrays 100, 102. However, in the event the column of memory for a column node circuit 110' is defective, the control circuitry 178 outputs a high thereby causing the inverter 176 to output a low. The low applied to the respective gates of the coupling transistors 170, 172 renders the transistors 170, 172 non-conductive, thereby isolating the column node circuit 110' from the digit lines in the arrays 100, 102. As a result, the digit lines D, D* in the arrays 100, 102 are decoupled from the sense amplifiers 120, 122 so that a short in a storage capacitor coupled to a digit line D, D* does not allow the sense amplifiers 120, 122 to drive the cell plate to ground or the supply voltage.

If a laser fuse 180 (FIG. 5A) is used in the control circuitry 178, the laser fuse is left unblown in the event the column of memory with which it is associated is not defective. The control circuitry 178 then applies a low to its inverter 176 so that the inverter outputs a voltage of Vccp. If the column is defective, the output of the control circuitry 178 is pulled high through the pull-up resistor 182, thereby causing the inverter 176 to output a low that turns off the coupling transistors 170, 172.

In a similar manner, if an anti-fuse 184 (FIG. 5B) is used in the control circuitry 178, the anti-fuse 184 is blown if the column of memory with which it is associated is not defective. If the column is defective, the anti-fuse 184 is left unblown, thereby allowing the output of the control circuitry 178 to be pulled high through the pull-up resistor 182.

In the embodiment of FIGS. 4A and 4B, the coupling transistors 170 coupled to the array 100 are operated in common with the coupling transistors 172 coupled to the array 102. However, it will be understood that separate control signals may be applied to the transistors 170, 172, respectively. Using this arrangement, a column node circuit 110' may be isolated from an array 100, 102 containing a defective column of memory cells and continue to interface with the same column of memory cells in the other array. However, the amount and complexity of circuitry needed to provide separate control signals for the transistors 170, 172 may very well outweigh the advantages of being able to access a column of one array 100 or 102 when the corresponding column of the other array 102 or 100 is defective.

The routing of the signal lines to the coupling transistors 170, 172 in the embodiment of the invention shown in FIGS. 4A and 4B is expected to be fairly routine because the signal lines can be routed in parallel with the signal lines coupling the inverters 114 to the I/O circuits 126. Moreover, the coupling transistors 170, 172, as well as the circuitry driving those transistors, can be relatively small since they do not need to couple a great deal of power. As a result, the circuitry for selectively decoupling the column node circuits 110' from the arrays 100, 102 uses relatively little surface area on the semiconductor die containing the memory device.

In an alternative embodiment, appropriate circuitry (not shown) is used to control the operation of the isolation transistors 150, 152 so all of the isolation transistors 150, 152 are non-conductive in the event a column of memory cells to which they are connected is defective. In addition to controlling the left isolation transistors 150 and the right isolation transistors 152 in all of the column node circuits 110' in two separate groups, the isolation transistors 150, 152 in each individual column node circuit 110' are also controlled on a column node-by-column node basis. However, the amount and complexity of circuitry that may be required to control the isolation transistors 150, 152 so that they perform both their original isolation function and the function of isolating column node circuits 110' from defective columns of memory cells may outweigh the value of eliminating the coupling transistors 170, 172 and their associated control circuitry.

Figure 1:
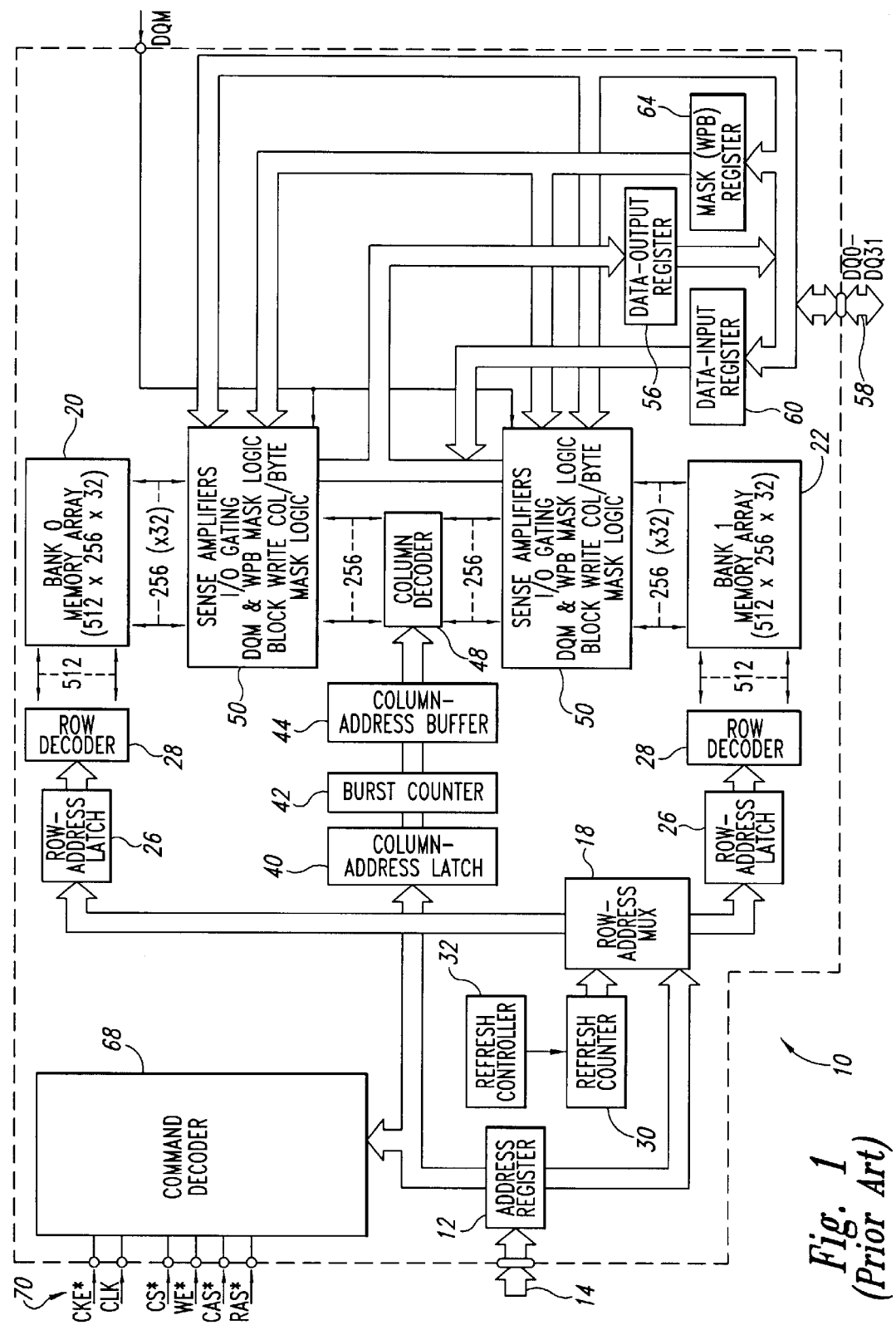
FIG. 1 is a block diagram of a conventional SDRAM.

FIG. 6 is a block diagram illustrating a computer system 200 including the SDRAM 10' of FIG. 1 containing the column circuitry of FIGS. 4A and 4B. The computer system 200 includes a processor 202 for performing various computing functions, such as executing specific software to perform specific calculations or tasks. The processor 202 includes a processor bus 204 that normally includes an address bus 206, a control bus 208, and a data bus 210. In addition, the computer system 200 includes one or more input devices 214, such as a keyboard or a mouse, coupled to the processor 202 to allow an operator to interface with the computer system 200. Typically, the computer system 200 also includes one or more output devices 216 coupled to the processor 202, such output devices typically being a printer or a video terminal. One or more data storage devices 218 are also typically coupled to the processor 202 to store data or retrieve data from external storage media (not shown). Examples of typical storage devices 218 include hard and floppy disks, tape cassettes, and compact disk read-only memories (CD-ROMs). The processor 202 is also typically coupled to cache memory 226, which is usually static random access memory ("SRAM") and to the SDRAM 10'through a memory controller 230. The memory controller 230 normally includes an address bus coupled to the address bus 14 (FIG. 1) and a control bus coupled to the control bus 70. The data bus 58 of the SDRAM 10' is coupled to the data bus 210 of the processor 202, either directly or through the memory controller 230.

From the foregoing it will be appreciated that, although specific embodiments of the invention have been described herein for purposes of illustration, various modifications may be made without deviating from the spirit and scope of the invention. For example, although the disclosed embodiment of the invention has been described as being coupled between two arrays of memory cells, it will be understood that it may be coupled to a single array of memory cells. Further, although the disclosed embodiment has been described for use in a SDRAM, it will be understood that it may be used in any present or future developed DRAM, including asynchronous DRAMs and packetized DRAMs, such as synchronous link DRAMs ("SLDRAMs") and RAMBUS DRAMs ("RDRAMs"). Accordingly, the invention is not limited except as by the appended claims.

What is claimed is:

1. In a memory device including an array of memory cells arranged in rows and columns, the array being divided into first and second sub-arrays each of which contains a digit line for each column of memory cells, the memory device further comprising a plurality of column circuits each of which is associated with a respective digit line in the first and second sub-arrays, a method of coupling data signals between each column circuit and the associated digit line in the first sub-array or the associated digit line in the second sub-array, the method comprising:

if neither of the digit lines associated with the column circuit is affected by a defect in the respective sub-arrays, allowing the column circuit to be coupled to the associated digit line in the first sub-array and the associated digit line in the second sub-array;

if the digit line in the first sub-array that is associated with the column circuit is affected by a defect in the first sub-array, preventing the column circuit from being coupled to the associated digit line in the first sub-array and allowing the column circuit to be coupled to the associated digit line in the second sub-array; and if the digit line in the second sub-array that is associated with the column circuit is affected by a defect in the second sub-array, preventing the column circuit from being coupled to the associated digit line in the second sub-array and allowing the column circuit to be coupled to the associated digit line in the first sub-array.

2. The method of claim 1 further comprising substituting a digit line for the digit line that is affected by a defect in the first array.

3. The method of claim 1 wherein the memory device comprises a dynamic random access memory.

4. The method of claim 3 wherein the memory device comprises a synchronous dynamic random access memory.

5. The method of claim 1 wherein each column circuit comprises:

a sense amplifier;

a first isolation switch coupled between the sense amplifier and the first sub-array; and a second isolation switch coupled between the sense amplifier and the second sub-array.

6. The method of claim 1 wherein the first and second sub-arrays contain for each column a respective pair of complimentary digit lines with which the column circuit is associated, and wherein the method comprises either allowing the column circuit to be coupled or preventing the column circuit from being coupled to the associated pair of complimentary digit lines in the first sub-array and the associated pair of complimentary digit lines in the second sub-array.

7. The method of claim 6 wherein each column circuit comprises:

a sense amplifier;

a first isolation switch coupled between the sense amplifier and the first sub-array;

a second isolation switch coupled between the sense amplifier and the second subarray; and an equilibration circuit.

8. In a memory device including first and second arrays of memory cells arranged in rows and columns each of which contains a digit line for each column of memory cells, the memory device further comprising a plurality of column circuits each of which is associated with a respective column in the first and second arrays, the memory device further comprising for each column circuit a first isolation switch coupled between the column circuit and the digit line for the associated column of the first array and a second isolation switch coupled between the column circuit and the digit line for the associated column of the second array, a method of coupling data signals between each column circuit and the digit line for the associated column in the first array or the associated digit line in the second array, the method comprising:

if a memory cell in the first array is being addressed and is in a column associated with the column circuit, and if the digit line for the column containing the addressed memory cell is unaffected by a defect in the first array, actuating the first isolation switch to couple the column circuit to the associated digit line in the first array;

if a memory cell in the second array is being addressed and is in a column associated with the column circuit, and if the digit line for the column containing the addressed memory cell is unaffected by a defect in the second array, actuating the second isolation switch to couple the column circuit to the associated digit line in the first array;

if a memory cell in the first array is being addressed and is in a column associated with the column circuit, and if the digit line for the column containing the addressed memory cell is affected by a defect in the first array, preventing the first isolation switch from being actuated to isolate the column circuit from the associated digit line in the first array; and if a memory cell in the second array is being addressed and is in a column associated with the column circuit, and if the digit line for the column containing the addressed memory cell is affected by a defect in the second array, preventing the second isolation switch from being actuated to isolate the column circuit from the associated digit line in the second array.

9. The method of claim 8, further comprising:

if a memory cell in the first array is being addressed and is in a column associated with the column circuit, and if the digit line for the column containing the addressed memory cell is affected by a defect in the first array, coupling the column circuit to a digit line for a column in the first array other than the column with which the column circuit is associated; and if a memory cell in the second array is being addressed and is in a column associated with the column circuit, and if the digit line for the column containing the addressed memory cell is affected by a defect in the second array, coupling the column circuit to a digit line for a column in the second array other than the column with which the column circuit is associated.

10. The method of claim 8 wherein the memory device comprises a dynamic random access memory.

11. The method of claim 10 wherein the memory device comprises a synchronous dynamic random access memory.

12. The method of claim 8 wherein each column circuit comprises a sense amplifier.

13. The method of claim 8 wherein the first and second arrays contain for each column a respective pair of complimentary digit lines with which the column circuit is associated, and wherein the method comprises either selectively actuating the first and second isolation switches to couple or isolate the column circuit from the associated pair of complimentary digit lines in the first array and the associated pair of complimentary digit lines in the second sub-array, respectively.

14. The method of claim 13 wherein each column circuit comprises:

a sense amplifier; and an equilibration circuit.

15. A method of coupling data signals between of a plurality of pairs of complimentary digit lines in a first array of memory cells and a plurality of column circuits, the method comprising:

coupling the data signals between at least one pair of complimentary digit lines in each column circuit and corresponding pairs of complimentary digit lines in the first array in the event neither of the corresponding pairs of digit lines in the first array are affected by a defect in the first array; and isolating each column circuit from the corresponding pair of digit lines in the first array if either of the digit lines in the first array with which the column circuit corresponds is affected by a defect in the first array.

16. The method of claim 15 wherein the data signals are coupled between the column circuits and a plurality of pairs of complimentary digit lines in a second array of memory cells, the method comprising:

coupling the data signals between at least one pair of complimentary digit lines in each column circuit and corresponding pairs of complimentary digit lines in the second array in the event neither of the corresponding pairs of digit lines in the second array are affected by a defect in the second array; and isolating each column circuit from the corresponding pair of digit lines in the second array if either of the digit lines in the second array with which the column circuit corresponds is affected by a defect in the second array.

17. The method of claim 15 further comprising substituting a pair of complimentary digit lines for the pair of complimentary digit lines in the first array that are affected by a defect.

18. The method of claim 15 wherein the memory cells comprise dynamic random access memory cells.

19. The method of claim 18 wherein the memory cells comprises synchronous dynamic random access memory cells.

\* \* \* \* \*